(12) United States Patent
Wang et al.

(10) Patent No.: US 12,315,981 B2
(45) Date of Patent: May 27, 2025

(54) TRANSMISSION LINE DEVICE COMPRIING FIRST AND SECOND CONDUCTIVE LINES ON ONE LEVEL SEPARATED FROM A THIRD CONDUCTIVE LINE ON ANOTHER LEVEL BY AN INTERVENING GROUND LAYER

(71) Applicants: UNIMICRON TECHNOLOGY CORP., Taoyuan (TW); National Taiwan University, Taipei (TW)

(72) Inventors: Yu-Kuang Wang, Taipei (TW); Ruey-Beei Wu, Taipei (TW); Ching-Sheng Chen, Taoyuan (TW); Chun-Jui Huang, Taoyuan (TW); Wei-Yu Liao, Taoyuan (TW); Chi-Min Chang, Taoyuan (TW)

(73) Assignees: UNIMICRON TECHNOLOGY CORP., Taoyuan (TW); NATIONAL TAIWAN UNIVERISTY, Taipei (TW)

( * ) Notice: Subject to any disclaimer, the term of this patent is extended or adjusted under 35 U.S.C. 154(b) by 287 days.

(21) Appl. No.: 18/058,799

(22) Filed: Nov. 25, 2022

(65) Prior Publication Data
US 2024/0128626 A1    Apr. 18, 2024

(30) Foreign Application Priority Data
Oct. 14, 2022  (TW) .................................. 111139051

(51) Int. Cl.
*H01P 3/08*    (2006.01)
*H05K 1/02*    (2006.01)

(52) U.S. Cl.
CPC .............. *H01P 3/088* (2013.01); *H01P 3/081* (2013.01); *H01P 3/082* (2013.01); *H05K 1/0237* (2013.01)

(58) Field of Classification Search
CPC .................................. H01P 3/082; H01P 3/088
(Continued)

(56) References Cited

U.S. PATENT DOCUMENTS 7,271,985 B1 * 9/2007 Buhler et al. ............ G11B 5/48
                                                        360/245.9
2005/0001638 A1    1/2005 Miller et al.
(Continued)

FOREIGN PATENT DOCUMENTS

TW      I654911 B     3/2019
TW      201927101 A   7/2019
TW      202214060 A   4/2022

*Primary Examiner* — Benny T Lee
(74) *Attorney, Agent, or Firm* — Birch, Stewart, Kolasch & Birch, LLP (57) ABSTRACT

A transmission line device includes a daisy chain structure composed of at least three daisy chain units arranged periodically and continuously. Each of the daisy chain units includes first, second and third conductive lines, and first and second conductive pillars. The first and second conductive lines at a first layer extend along a first direction and are discontinuously arranged. The third conductive line at a second layer extends along the first direction and is substantially parallel to the first and second conductive lines. The first conductive pillar extends in a second direction. The second direction is different from the first direction. A first part of the first conductive pillar is connected to the first and third conductive lines. The second conductive pillar extends in the second direction. A first part of the second conductive pillar is connected to the second and third conductive lines.

17 Claims, 5 Drawing Sheets

(58) Field of Classification Search
USPC .......................................................... 333/238
See application file for complete search history.

(56) References Cited

U.S. PATENT DOCUMENTS

2007/0130555 A1* 6/2007 Osaka ..................... H01L 23/66
                                                    257/E23.079
2020/0266512 A1   8/2020 Liu et al.

* cited by examiner

TRANSMISSION LINE DEVICE COMPRIING FIRST AND SECOND CONDUCTIVE LINES ON ONE LEVEL SEPARATED FROM A THIRD CONDUCTIVE LINE ON ANOTHER LEVEL BY AN INTERVENING GROUND LAYER

CROSS REFERENCE TO RELATED APPLICATIONS

This application claims priority of Taiwan Patent Application No. 111139051, filed on Oct. 14, 2022, the entirety of which is incorporated by reference herein.

BACKGROUND OF THE INVENTION

Field of the Invention

The present invention relates to a transmission device, in particular to a structure for measuring the length of a via stub of a transmission line.

Description of the Related Art

In high-speed printed circuit board (PCB) manufacturing, it is necessary to use back-drilling to remove excess sections of vias in the transmission circuits. However, the current back-drilling technology has problems such as misalignment, length limits for the process, and destructive cross-section measurements. The conventional technology uses the resonance characteristics at a specific frequency to detect the length of the via stub of the transmission circuits in the printed circuit board resulting from back drilling. However, the conventional technology is limited by the frequency range that can be measured with the equipment. In addition, the variation of the resonance characteristic curve is not obvious to be detected due to the influence of multiple reflections. It is hard to determine the difference in the length of the via stubs with precision, and the destructive cross-section measurement is still required. As the transmission rate increases and the size of the transmission circuits becomes smaller, the short via stub gradually becomes a factor that cannot be ignored. Efficient detection of the short via stub becomes important.

SUMMARY OF THE INVENTION

An embodiment of the present invention provides a transmission line device. The transmission line device includes a daisy chain structure. The daisy chain structure is composed of at least three daisy chain units arranged periodically and continuously. Each of the daisy chain units includes a first conductive line, a second conductive line, a third conductive line, a first conductive pillar and a second conductive pillar. The first conductive line and second conductive line located at a first layer extend along a first direction and are discontinuously arranged. The third conductive line located at a second layer extends along the first direction and is substantially parallel to the first conductive line and second conductive line. The first conductive pillar extends in a second direction. The second direction is different from the first direction. The first conductive pillar has a first part and a second part. The first part of the first conductive pillar is connected to the first conductive line and the third conductive line. The second conductive pillar extends along the second direction, wherein the second conductive pillar has a first part and a second part. The first part of the second conductive pillar is connected to the second conductive line and the third conductive line.

In some embodiments, a first end and a second end of the first part of the first conductive pillar are respectively connected to a first terminal of the first conductive line and a first terminal of the third conductive line, and wherein a first end and a second end of the first part of the second conductive pillar are respectively connected to a first terminal of the second conductive line and a second terminal of the third conductive line.

In some embodiments, the first conductive line has a first length in the first direction, the second conductive line has a second length in the first direction, and the first length is equal to the second length.

In some embodiments, the third conductive line has a third length in the first direction, and the third length is equal to the total of the first length and the second length.

In some embodiments, the second part of the first conductive pillar has a first height in the second direction, the second part of the second conductive pillar has a second height in the second direction, and the first height is equal to the second height.

In some embodiments, the second conductive line of one of the daisy chain units is connected to the first conductive line of an adjacent daisy chain unit.

In some embodiments, the third conductive line of one of the daisy chain units and the third conductive line of an adjacent daisy chain unit are spaced apart from each other along the first direction.

In some embodiments, the first direction is a horizontal direction, and the second direction is a vertical direction.

In some embodiments, the transmission line device further comprises a dielectric stack surrounding the third conductive lines, the first conductive pillars and the second conductive pillars of the daisy chain units and not surrounding the first conductive lines and the second conductive line of the daisy chain units.

In some embodiments, the first conductive lines and the second conductive lines of the daisy chain units are located on a first surface of the dielectric stack, and the third conductive lines of the daisy chain units, the first conductive pillars and the second conductive pillars are located between the first surface and a second surface of the dielectric stack.

In some embodiments, in each of the daisy chain units, a first end of the second part of the first conductive pillar is connected to the first terminal of the third conductive line, a second end of the second part of the first conductive pillar is located between the first surface and the second surface of the dielectric stack, a first end of the second part of the second conductive pillar is connected to the second terminal of the third conductive line, and wherein a second end of the second part of the second conductive pillar is located between the first surface and the second surface of the dielectric stack.

In some embodiments, each of the daisy chain units further comprises a first ground layer located at a third layer, disposed in the dielectric stack, and extending along the first direction, wherein the third layer is located between the first layer and the second layer along the second direction.

In some embodiments, each of the daisy chain units further comprises a second ground layer located at a fourth layer, disposed in the dielectric stack, and extending along the first direction, wherein the second layer is located between the first layer and the fourth layer along the second direction.

In some embodiments, the transmission line device further comprises a third ground layer located at a fifth layer, disposed in the dielectric stack and extending along the first direction, wherein the third ground layer is electrically isolated from each of the daisy chain units.

In some embodiments, the second layer is located between the first layer and the fifth layer along the second direction.

In some embodiments, the first conductive line, the second conductive line and the third conductive line of each of the daisy chain units are respectively a first microstrip line, a second microstrip line and a stripline of a printed circuit board.

In some embodiments, the first conductive pillar and the second conductive pillar of each of the daisy chain units are respectively a first via and a second via of the printed circuit board.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
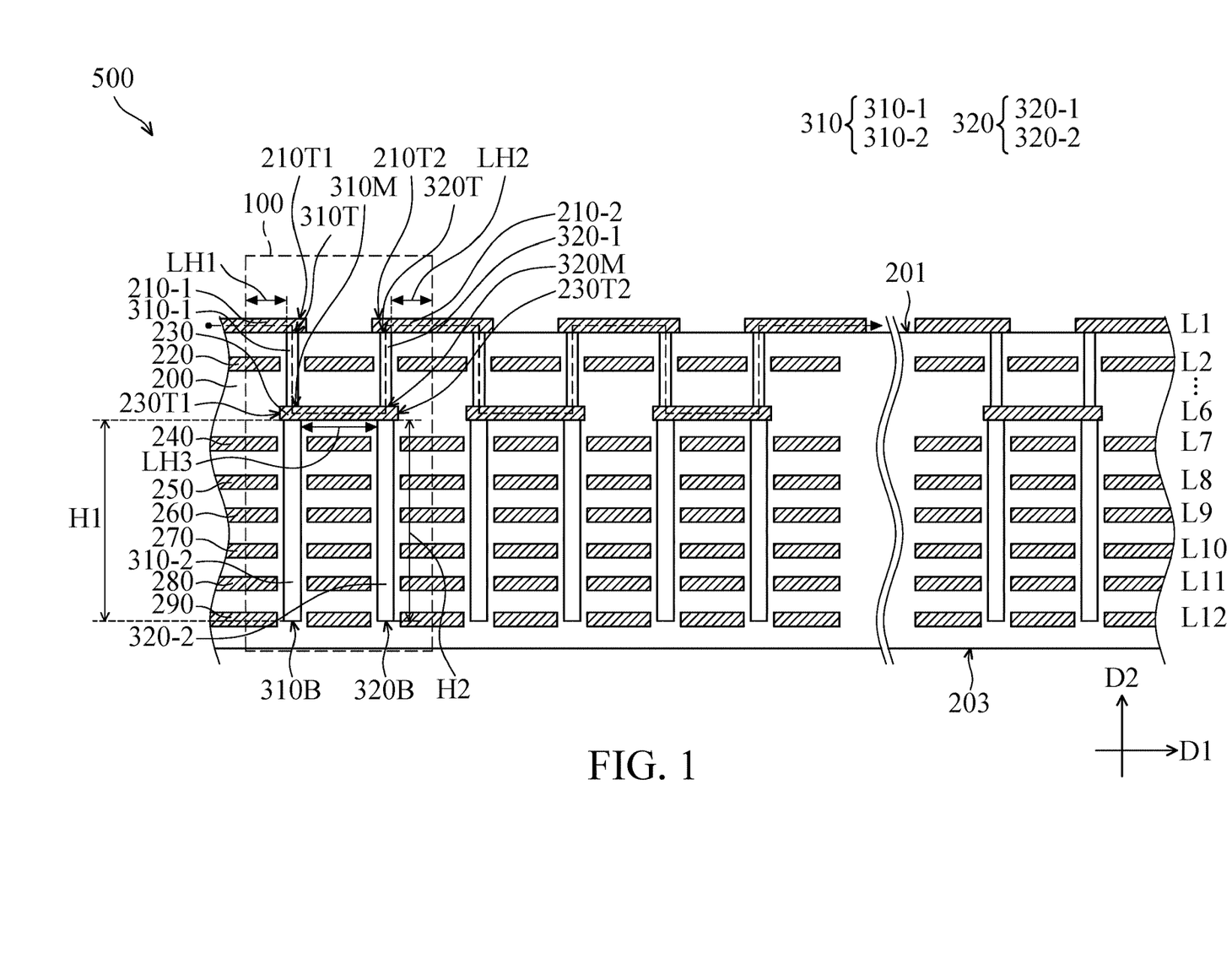
FIG. 1 is a cross-sectional view of a transmission line device in accordance with one embodiment of the disclosure.

FIG. 1 is a cross-sectional view of a transmission line device 500 in accordance with one embodiment of the disclosure. In some embodiments, the transmission line device 500 can be applied to a multilayer printed circuit board (PCB) device or a semiconductor device having a multilayer interconnect structure, which can be used to measure the length of the transmission line stub (via stub). For illustration, the transmission line device 500 shown in FIG. 1 uses a 12-layer printed circuit board device as an example, in which from the topmost layer to the bottommost layer are respectively marked with a layer L1 to a layer L12 in sequence. However, the disclosure can also be applied to other printed circuit board devices with different numbers of layers or other semiconductor devices having interconnect structures with different numbers of stacking layers. Moreover, a first direction D1 labeled in FIG. 1 is defined as the horizontal direction (or an extending direction of the conductive lines at various layers), and a second direction D2 is defined as the vertical direction (or an extending direction of the conductive pillars). As shown in FIG. 1, the transmission line device 500 includes a daisy chain structure composed of a plurality of daisy chain units 100 periodically and continuously arranged along the first direction D1. In some embodiments, the number (N) of the daisy chain units 100 is greater than or equal to 3 (N=3). For example, the daisy chain structure of the transmission line device 500 may be composed of three, four, five, six or more daisy chain units 100. In one embodiment shown in FIG. 1, the daisy chain structure of the transmission line device 500 is composed of at least three daisy chain units 100. However, the disclosure is not limited to the disclosed embodiments.

As shown in FIG. 1, each daisy chain unit 100 includes a first conductive line 210-1, a second conductive line 210-2, a third conductive line 230, a first conductive pillar 310 and a second conductive pillar 320. Both the first conductive line 210-1 and the second conductive line 210-2 of the daisy chain unit 100 are located at a first layer (e.g., the layer L1 in FIG. 1), extend along the first direction D1 and discontinuously arranged, so that a first terminal 210T1 of the first conductive line 210-1 is close to a second terminal 210T2 of the second conductive line 210-2. As shown in FIG. 1, the first conductive line 210-1 has a first length LH1 in the first direction D1, and the second conductive line 210-2 has a second length LH2 in the first direction D1. The magnitude relationship between the first length LH1 of the first conductive line 210-1 and the second length LH2 of the second conductive line 210-2 is not limited. In some embodiments, the first length LH1 is equal to the second length LH2. In other embodiments, the first length LH1 is not equal to the second length LH2. For example, the first length LH1 may be greater or less than the second length LH2. In some embodiments, the second conductive line 210-2 of one of the daisy chain units 100 in the daisy chain structure is connected to the first conductive line 210-1 of an adjacent daisy chain unit 100. In addition, the third conductive line 230 of one of the daisy chain units 100 and the third conductive line 230 of an adjacent daisy chain unit 100 of the daisy chain structure are spaced apart from each other along the first direction D1.

As shown in FIG. 1, the third conductive line 230 of the daisy chain unit 100 is located at a second layer different from the first layer. For example, if the first conductive line 210-1 and the second conductive line 210-2 are located at the layer L1, the third conductive line 230 is located at the layer L6. However, the third conductive lines 230 may also be located at other layers different from the layer L1. The third conductive line 230 extends along the first direction D1 and is substantially parallel to the first conductive line 210-1 and the second conductive line 210-2. As shown in FIG. 1, the third conductive line 230 has a third length LH3 in the first direction D1. The magnitude relationship between the third length LH3 and the first length LH1 or the second length LH2 is not limited. The third length LH3 may be greater than, equal to, or less than the first length LH1 (or the second length LH2). In some embodiments, the third length LH3 is equal to the total of the first length LH1 and the second length LH2 (i.e., LH3=LH1+LH2). In other embodiments, the third length LH3 is not equal to the total of the first length LH1 and the second length LH2 (i.e., LH3≠LH1+LH2). For example, the third length LH3 may be greater or less than the total of the first length LH1 and the second length LH2.

As shown in FIG. 1, the first conductive pillar 310 and the second conductive pillar 320 of the daisy chain unit 100 extend along the second direction D2 and are disposed parallel to each other. In some embodiments, the first conductive pillar 310 has a first part 310-1 and a second part 310-2 connected to each other. The first part 310-1 is located between the first layer (e.g., the layer L1 in FIG. 1) where the first conductive line 210-1 and the second conductive line 210-2 are located and the second layer (e.g., the layer L6 in FIG. 1) where the third conductive line 230 is located. In addition, a first end 310T and a second end 310M of the first part 310-1 are respectively connected to the first terminal 210T1 of the first conductive line 210-1 and a first terminal 230T1 of the third conductive line 230. A first end of the second part 310-2 of the first conductive pillar 310 (the same as the second end 310M of the first part 310-1) is connected to the first terminal 230T1 of the third conductive line 230.

As shown in FIG. 1, the second conductive pillar 320 has a first part 320-1 and a second part 320-2 connected to each other. The first part 320-1 is located between the first layer (e.g., the layer L1 in FIG. 1) where the first conductive line 210-1 and the second conductive line 210-2 are located and the second layer (e.g., the layer L6 in FIG. 1) where the third conductive line 230 is located. In addition, a first end 320T and a second end 320M of the first part 320-1 are respectively connected to the second terminal 210T2 of the second conductive line 210-2 and a second terminal 230T2 of the third conductive line 230. A first end of the second part 320-2 of the second conductive pillar 320 (the same as the second end 320M of the first part 320-1) is connected to the second terminal 230T2 of the third conductive line 230.

In some embodiments, the second part 310-2 of the first conductive pillar 310 has a first height H1 in the second direction D2. The first part 320-1 of the first conductive pillar 310 has a second height H2 in the second direction D2. The magnitude relationship between the first height H1 and the second height H2 is not limited. In some embodiments, the first height H1 is equal to the second height H2. In other embodiments, the first height H1 is not equal to the second height H2. For example, the first height H1 may be greater or less than the second height H2.

In some embodiments, the first conductive line 210-1, the second conductive line 210-2, the third conductive line 230, the first conductive pillar 310 and the second conductive pillar 320 include metal materials, metal nitrides, metal silicides, or a combination thereof. In some embodiments, the metal materials include copper (Cu), platinum (Pt), titanium (Ti), aluminum (Al), gold (Au), silver (Ag), tin (Sn), palladium (Pd), nickel (Ni) or alloys thereof, but not limited thereto.

As shown in FIG. 1, the transmission line device 500 further includes a dielectric stack 200. The dielectric stack 200 may include a plurality of dielectric layers (not shown) alternately stacked with the first conductive line 210-1, the second conductive line 210-2 and the third conductive line 230 along the second direction D2, so that the first conductive line 210-1, the second conductive line 210-2 and the third conductive line 230 are located at the designated layers. In addition, the first conductive pillar 310 and the second conductive pillar 320 pass through the dielectric stack 200 to connect the conductive lines at different layers. The dielectric stack 200 surrounds the third conductive line 230, the first conductive pillar 310 and the second conductive pillar 320 of each of the daisy chain units 100, and does not surround the first conductive lines 210-1 and the second conductive line 210-2 of each of the daisy chain units 100 of the transmission line device 500. In detail, the first conductive line 210-1 and the second conductive line 210-2 of each of the daisy chain units 100 in the daisy chain structure are located on a first surface 201 of the dielectric stack 200. In addition, the third conductive line 230, the first conductive pillar 310 and the second conductive pillar 320 of each of the daisy chain units 100 of the transmission line device 500 are located between the first surface 201 and a second surface 203 of the dielectric stack 200. As shown in FIG. 1, both the first conductive pillar 310 and the second conductive pillar 320 do not pass through the dielectric stack 200. Therefore, a second end 310B of the second part 310-2 of the first conductive pillar 310 and a second end 320B of the second part 320-2 of the second conductive pillar 320 are located between the first surface 201 and the second surface 203 of the dielectric stack 200. In addition, the first surface 201 and the second surface 203 of the dielectric stack 200 are substantially parallel to the first direction D1.

In some embodiments, the dielectric stack 200 includes inorganic materials (e.g., silicon oxide, silicon nitride, silicon oxynitride, other suitable materials, or stacked layers of at least two of the aforementioned materials), organic materials (e.g., polyimide (PI), polybenzazole (PBO), silicone, epoxy, benzocyclobutene (BCB), other suitable materials, or stack layers of at least two of the aforementioned materials), other suitable materials, or a combination thereof. The thickness and material of each dielectric layer in the dielectric stack 200 can be determined according to design requirements, and the disclosure is not limited to the disclosed embodiments.

In some embodiments, the transmission line device 500 may further include a ground layer. As shown in FIG. 1, the transmission line device 500 further includes a ground layer 220 located at the third layer. The ground layer 220 is disposed in the dielectric stack 200 and extends along the first direction D1. In some embodiments, the third layer where the ground layer 220 is located may be located between the first layer where the first conductive line 210-1 and the second conductive line 210-2 are located and the second layer where the third conductive line 230 is located along the second direction D2. For example, when the first layer is the layer L1 and the second layer is the layer L6, the third layer can be the layer L2 (FIG. 1) or other layer, for example, the layers L3, L4 or L5 (not shown), and the disclosure is not limited to the disclosed embodiments.

In some embodiments, the transmission line device 500 further includes a ground layer 240 at a fourth layer. The ground layer 240 is disposed in the dielectric stack 200 and extends along the first direction D1. In some embodiments, the second layer where the third conductive line 230 is located is located between the first layer where the first conductive line 210-1 the second conductive line 210-2 are located and the fourth layer where the ground layer 240 is located along the second direction D2. For example, when the first layer is the layer L1 and the second layer is the layer L6, the fourth layer may be the layer L7 (FIG. 1) or other layer such as the layer L8, L9, L10, L11 or L12, and the disclosure is not limited to the disclosed embodiments.

In some embodiments, the transmission line device 500 may also include other ground layers. As shown in FIG. 1, the transmission line device 500 further includes ground layers 250, 260, 270, 280 or 290 at the fifth layer, disposed in the dielectric stack 200 and extending along the first direction D1. In some embodiments, the second layer where the third conductive line 230 is located between the first layer where the first conductive line 210-1 and the second conductive line 210-2 are located and the fifth layer where the ground layers 250, 260, 270, 280 or 290 are located along the second direction D2. For example, when the first layer is the layer L1 and the second layer is the layer L6, the fifth layer can be other layers such as the layers L8, L9, L10, L11 and L12, and the disclosure is not limited to the disclosed embodiments. In some embodiments, the ground layer 250, 260, 270, 280 or 290 is electrically isolated from each of the daisy chain units 100. In practice, the ground layers 250, 260, 270, 280 or 290 can be electrically connected to the ground layers 220 and 240 by using a ground via (gnd via) (not shown).

In one embodiment in which the transmission line device 500 is a printed circuit board, the first conductive line 210-1, the second conductive line 210-2 and the third conductive line 230 of each of the daisy chain units 100 in the transmission line device 500 may serve as a first microstrip line, a second microstrip line and a stripline of the printed circuit board, respectively. In addition, the first conductive line 210-1, the second conductive line 210-2, and the third conductive line 230 may be any kind of transmission lines (e.g., coplanar microstrip lines, microstrip lines or striplines). The first conductive pillar 310 and the second conductive pillar 320 of each of daisy chain units 100 may serve as a first via and a second via of the printed circuit board, respectively. The second part 310-2 of the first conductive pillar 310 and the second part 320-2 of the second conductive pillar 320 may serve as via stubs. In addition, the first height H1 of the second part 310-2 of the first conductive pillar 310 and the second height H2 of the second part 320-2 of the second conductive pillar 320 may serve as the lengths H1 and H2 of the via stubs.

Figure 2:
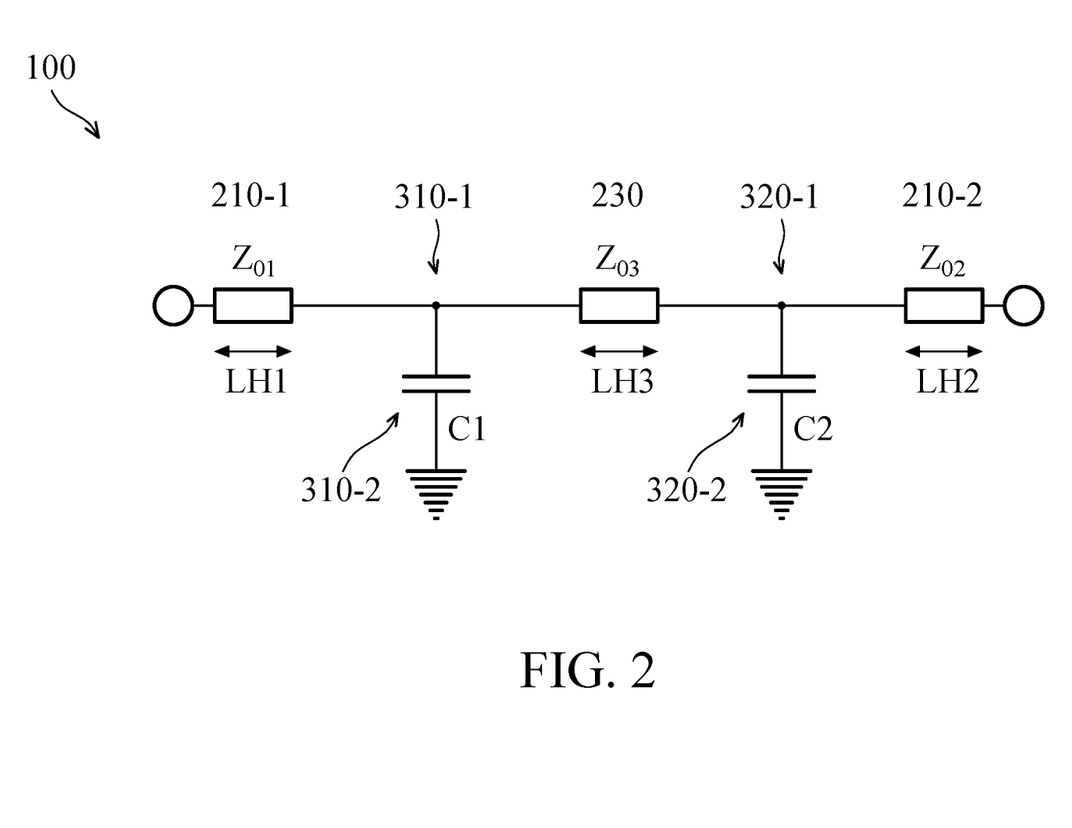
FIG. 2 is an equivalent circuit diagram of a daisy chain unit in accordance with one embodiment of the disclosure.

FIG. 2 is an equivalent circuit diagram of the daisy chain unit 100 in accordance with one embodiment of the disclosure. In the daisy chain unit 100, the first conductive line 210-1 located at the first layer has a first length LH1 and an impedance $Z_{01}$. The second conductive line 210-2 located at the first layer has a second length LH2 and an impedance $Z_{02}$. The third conductive line 230 located at the second layer has a third length LH3 and an impedance $Z_{03}$. The first part 310-1 of the first conductive pillar 310 of FIG. 1 is connected to the first conductive line 210-1 and the third conductive line 230. The first part 320-1 of the second conductive pillar 320 of FIG. 1 is connected to the second conductive line 210-2 and the third conductive line 230. In addition, the second part 310-2 of the first conductive pillar 310 and the second part 320-2 of the second conductive pillar 320 form via stubs. The second part 310-2 of the first conductive pillar 310 and the second part 320-2 of the second conductive pillar 320 respectively have equivalent parasitic capacitances C1 and C2 due to the first height H1 and the second height H2 as shown in FIG. 1 (which can serve as the lengths of the via stubs) in the second direction D2 (FIG. 1). The transmission line device 500 in accordance with some embodiment of the disclosure uses continuously arranged daisy chain units 100 to form an electromagnetic bandgap (EBG) structure. When the number (N) of the daisy chain units 100 is greater than or equal to 3, an obvious and distinguishable EBG "stopband" (hereinafter referred to as the "stopband") will be generated because the via stub resonates at a specific frequency, and the insertion loss value will be increased obviously in the diagram of insertion loss ($|S_{dd21}$ (dB)$|$) versus frequency (e.g., FIG. 3). Therefore, a diagram of the obtained maximum insertion loss ($|S_{ad21, min}$ (dB)$|$) corresponding stopbands versus the length of the via stub can be plotted to establish the corresponding relationship, which can effectively determine the length of the via stub. The aforementioned characteristics will be described below with reference to FIGS. 3 and 4.

Figure 3:
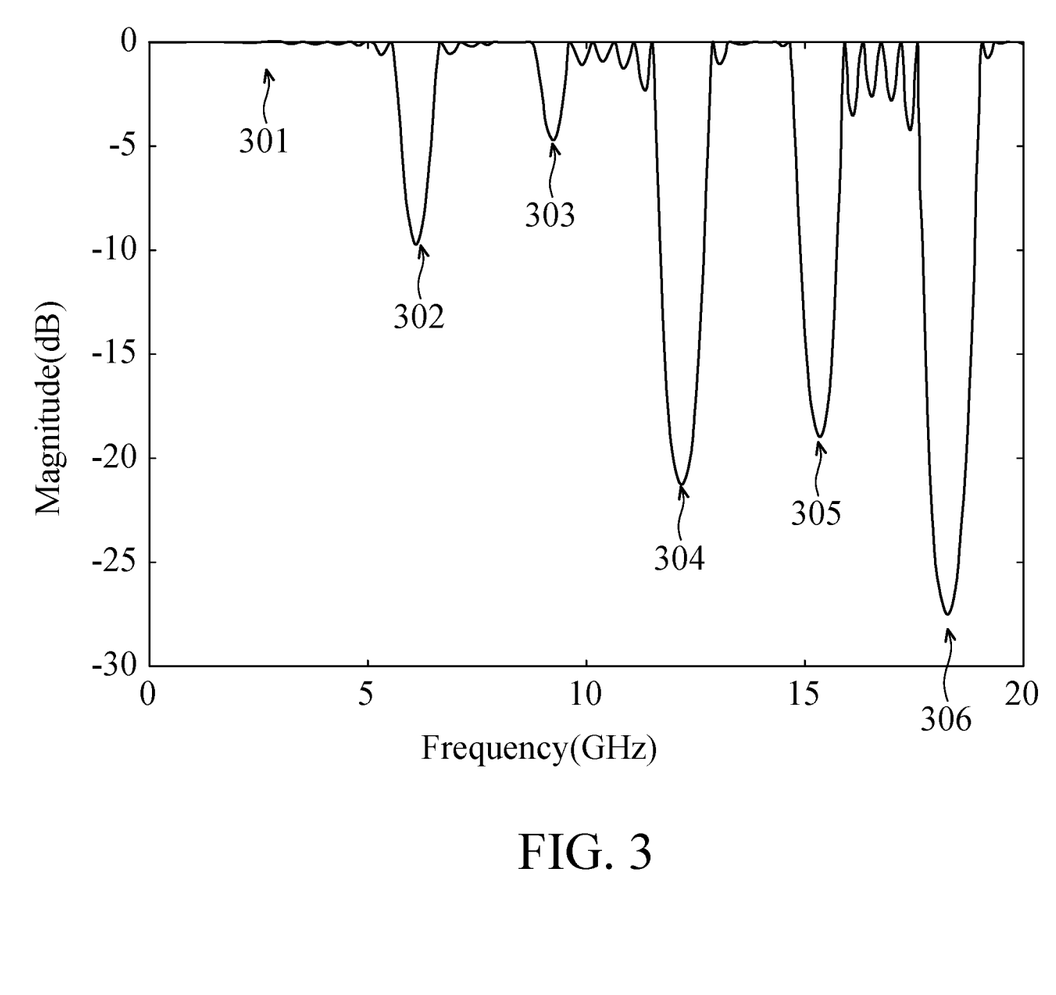
FIG. 3 is a diagram of the insertion loss in magnitude versus frequency of the transmission line device in accordance with one embodiment of the disclosure.

FIG. 3 is a diagram of the insertion loss in magnitude (in dB) versus frequency in GHz of the transmission line device 500 (FIG. 1) in accordance with one embodiment of the disclosure. FIG. 3 is obtained by measuring a daisy chain structure of FIG. 1 composed of six daisy chain units 100 (N=6). In each of the daisy chain units 100, an impedance $Z_{01}$ and the first length LH1 of the first conductive line 210-1 and the impedance $Z_{02}$ and the second length LH2 of the second conductive line 210-2 are half of the impedance $Z_{03}$ and half of the third length LH3 of the third conductive line 230. The impedance $Z_{03}$ of the third conductive line 230 is about 100 ohm. The third length LH3 is about 1.5 cm. The equivalent parasitic capacitance C1 and C2 of FIG. 2 of the first conductive pillar 310 and the second conductive pillar 320 are both 40 fF. It can be seen from FIG. 3 that when the daisy chain structure of the transmission line device 500 is under the condition that the lengths of the via stubs is fixed, six stopbands (including a first stopband 301, a second stopband 302, a third stopband 303, a fourth stopband 304, a fifth stopband band 305 and a sixth stopband 306) would be generated in the frequency range of 0 GHz to 20 GHz. In addition, the variation of the maximum insertion loss corresponding to the even-order stopband is greater than that corresponding to the odd-order stopband. In detail, compared with the variations of the maximum insertion loss corresponding to the first stopband 301 and the third stopband 303, the variations of the maximum insertion loss corresponding to the second stopband 302 and the fourth stopband band 304 have significant changes, which are reduced by about 10 dB and 22 dB respectively. Similarly, compared with the variation of the maximum insertion loss corresponding to fifth stopband 305, the variation of the maximum insertion loss corresponding to the sixth stop band 306 is more obvious, which is reduced by about 28 dB. Therefore, the variation of the maximum insertion loss ($|S_{dd21, min}$ (dB)$|$) corresponding to the even-order stopband can be used to further establish the corresponding relationship with the length of the via stub.

Figure 4:
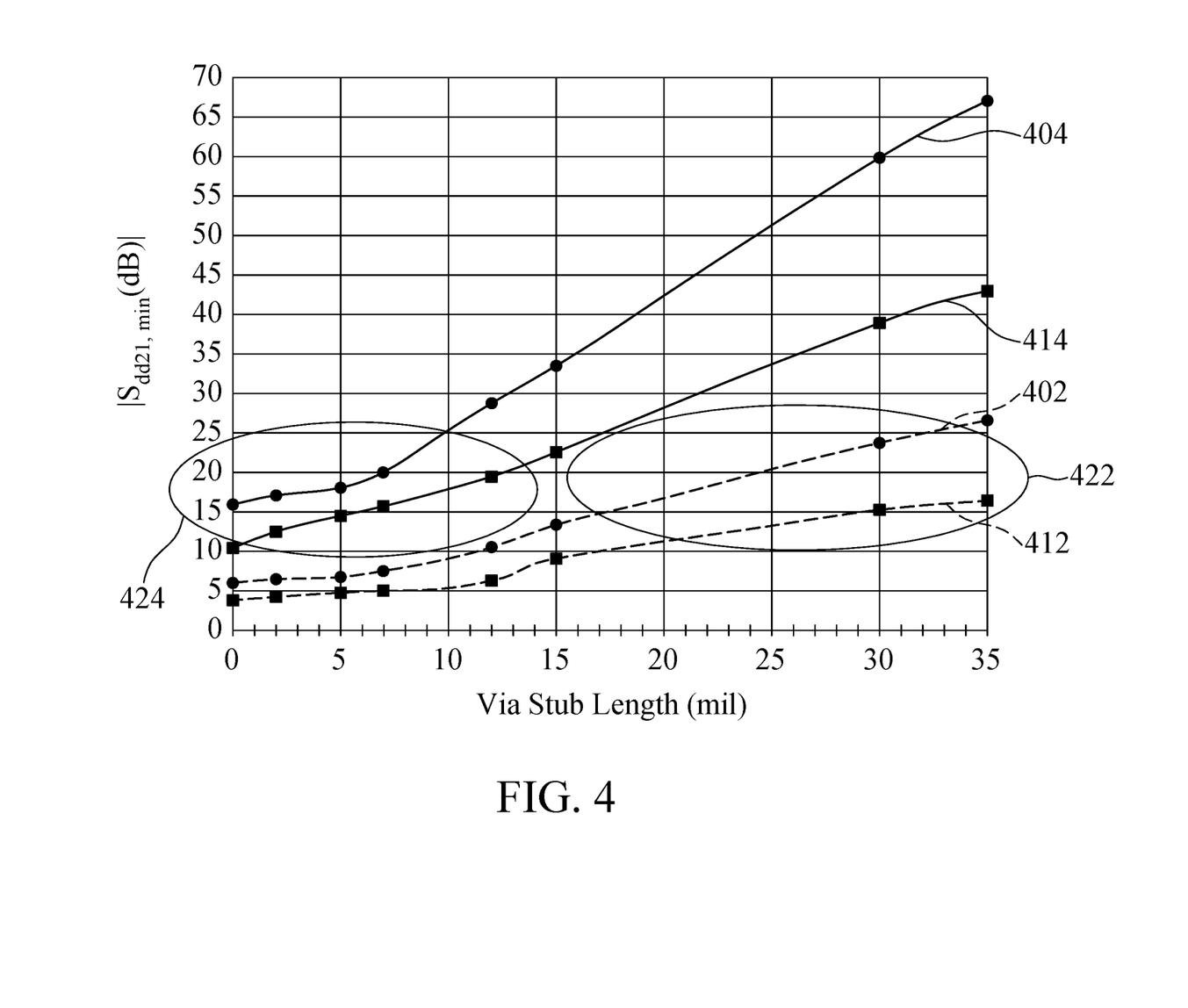
FIG. 4 is a diagram of the variation of the maximum insertion loss versus the length of a via stub of the transmission line device in accordance with one embodiment of the disclosure.

FIG. 4 is a diagram of the variation of the maximum insertion loss $|S_{dd21, min}$ (dB) $|$ versus the length of the via stub in mil of the transmission line device 500 (FIG. 1) in accordance with one embodiment of the disclosure, which shows the relationship between the length of the via stub and the variation of the maximum insertion loss corresponding to the second stopband and the fourth stopband of two daisy chain structures having different lengths of the conductive lines. Curves 402, 404, 412, and 414 of FIG. 4 are obtained by measuring the variation of the maximum insertion loss corresponding to the even-order stopband of the daisy chain structures composed of six daisy chain units 100 (N=6) with different lengths of the via stubs (the first height H1 and the second height H2). In each of the daisy chain units 100 of the daisy chain structures, the impedance $Z_{01}$ and the first length LH1 of the first conductive line 210-1 and the impedance $Z_{02}$ and the second length LH2 of the second conductive line 210-2 are half of the impedance $Z_{03}$ and half of the third length LH3 of the third conductive line 230. In addition, the equivalent parasitic capacitance C1 (FIG. 2) of the first conductive pillar 310 is equal to the equivalent parasitic capacitance C2 (FIG. 2) of the second conductive pillar 320 (that is, the first height H1 is equal to the second height H2 in FIG. 1). For illustration, the measured daisy chain structures corresponding to the curves 402, 404, 412, and 414 will be identified by taking the third length LH3 (FIG. 2) of the third wire 230 (FIG. 2) as the simplified identification condition. As shown in FIG. 4, the curves 402 and 404 respectively show the relationship between the variations of the maximum insertion loss corresponding to the second stopband and the fourth stopband band and the lengths of the via stubs of the daisy chain structures with the third length LH3 of about 1.0 cm. Curves 412 and 414 respectively show the relationship between the variations of the maximum insertion loss corresponding to the second stopband and the fourth stopband band and the lengths of the via stubs of the daisy chain structures with the third length LH3 of about 1.5 cm. It is defined in FIG. 4 that if the variation of the maximum insertion loss corresponding to the even-order stopband per unit length of the via stub of the unit cell ($|S_{dd21, min}$ (dB) |/via stub length (mil)) is greater than or equal to about 0.5 dB/mil, this even-order stopband is suitable for detecting the corresponding length of the via stub.

As shown in FIG. 4, when the length of the via stub is less than or equal to about 15 mil, the curves 404 and 414 (labeled by a circle 424) satisfy the definition that the variation of the maximum insertion loss corresponding to the even-order stopband per unit length of the via stub of the unit cell ($|S_{dd21, min}$ (dB)|/via stub length (mil)) is greater than or equal to about 0.5 dB/mil. In addition, when the length of the via stub is greater than or equal to about 15 mil, the curves 402 and 412 (labeled by a circle 422) can satisfy the definition that the variation of the maximum insertion loss corresponding to the even-order stopband per unit length of the via stub of the unit cell ($|S_{dd21, min}$ (dB)|/via stub length (mil)) is greater than or equal to about 0.5 dB/mil. It can be seen from the above that when the length of the via stub is less than or equal to 15 mil, the variation of the maximum insertion loss corresponding to the fourth stopband is suitable for detecting the corresponding length of the via stub. When the length of the via stub is greater than or equal to 15 mil, the variation of the maximum insertion loss corresponding to the second stopband is suitable for detecting the corresponding length of the via stub.

Figure 5:
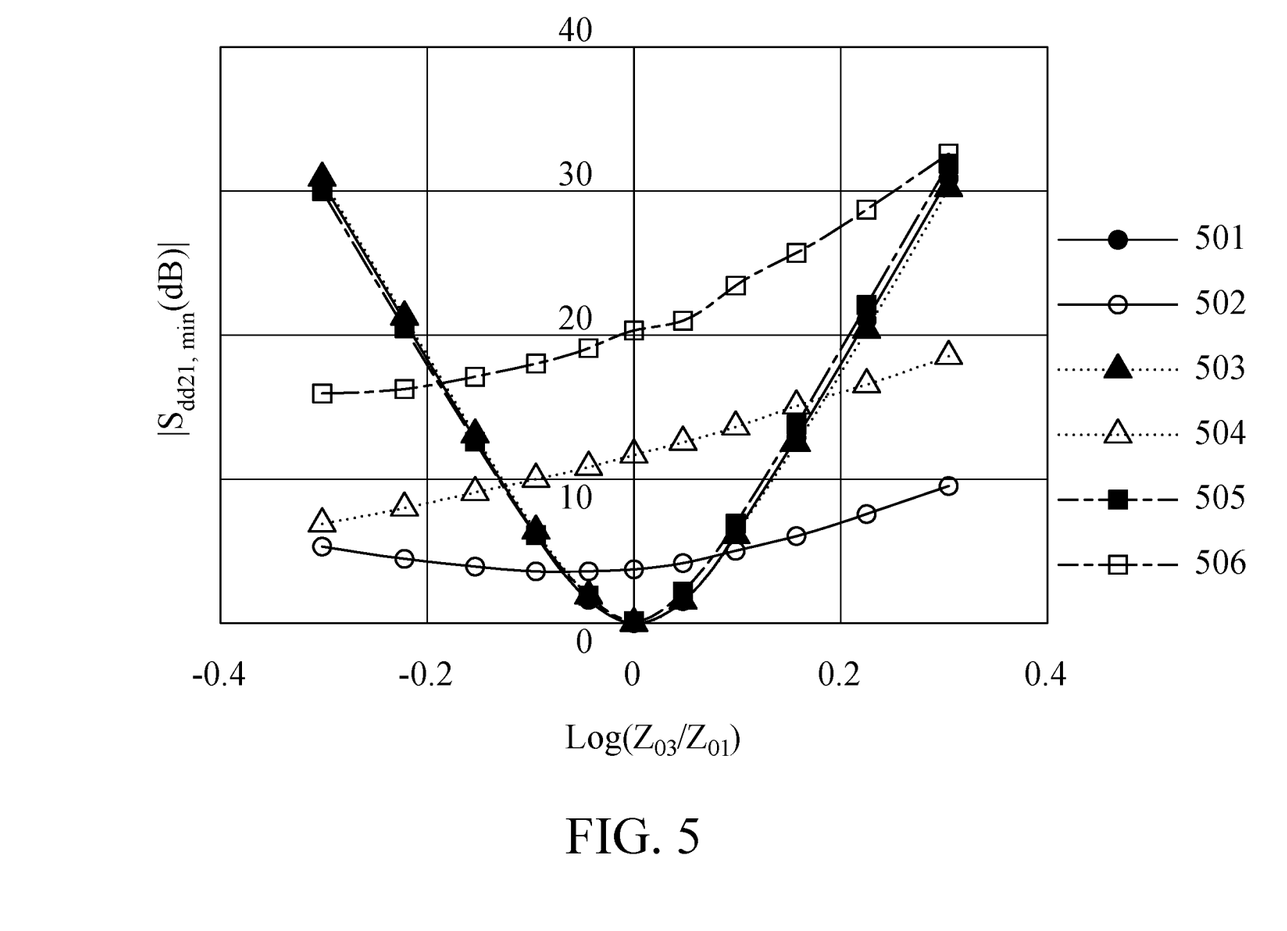
FIG. 5 is a diagram of the impedance ratio of the conductive lines at different layers versus the variation of the maximum insertion loss of the transmission line device in accordance with one embodiment of the disclosure.

FIG. 5 is a diagram of the impedance ratio of the conductive lines at different layers versus the variation of the maximum insertion loss $|S_{dd21, min}$ (dB)| of the transmission line device 500 of FIG. 1 in accordance with one embodiment of the disclosure. Curves 501, 502, 503, 504, 505, and 506 in FIG. 5 are obtained by measuring the variation of the maximum insertion loss corresponding to the first stopband to the sixth stopband of the different daisy chain structures of FIG. 1 composed of six daisy chain units 100 (N=6) by changing the impedance $Z_{03}$ of the third conductive line 230 of FIG. 2 (The impedance $Z_{03}$ of the third conductive line 230 ranges from about 50 to about 200 ohm. The impedance ratio log ($Z_{03}/Z_{01}$) ranges from about 0.5 to about 2, and 11 groups of data points corresponding to the impedance ratios of 0.5, 0.6, 0.7, 0.8, 0.9, 1 and the corresponding reciprocals are measured). In each of the daisy chain units 100 of the daisy chain structures, the impedance $Z_{01}$ of the first conductive line 210-1 and the impedance $Z_{02}$ of the second conductive line 210-2 are both about 100 ohm. The first length LH1 of the first conductive line 210-1 and the second length LH2 of the second conductive line 210-2 are both about 0.75 cm. The third length LH3 of the third conductive line 230 is about 1.257 cm. In addition, the equivalent parasitic capacitance C1 of the first conductive pillar 310 is equal to the equivalent parasitic capacitance C2 of the second conductive pillar 320. As shown in FIG. 5, when the impedance ratio (Log ($Z_{03}/Z_{01}$)) of the first conductive line 210-1 (or the second conductive line 210-2) to the third conductive line 230 of the daisy chain unit 100 increases, the variations of the maximum insertion loss corresponding to the odd-order stopbands (the curves 501, 503, 505) increase significantly, while the variations of the maximum insertion loss corresponding to the even-order stopbands (the curves 502, 504, 506) are not much different. Therefore, when the transmission line device 500 in accordance with some embodiments of the disclosure is used to detect the length of the via stub, the transmission line device 500 can reduce the influence of the different impedance ratios of the conductive lines to the variations of the maximum insertion loss corresponding to the even-order stopbands. In addition, the transmission line device 500 can simultaneously observe the matching degree of the first conductive line 210-1/the second conductive line 210-2 and the third conductive line 230 from the variations of the maximum insertion loss corresponding to the odd-order stopbands.

Embodiments provide a transmission line device. The transmission line device includes a daisy chain structure composed of at least three daisy chain units arranged periodically and continuously. In addition, each daisy chain unit uses the first part of the conductive pillar to connect the conductive lines located at different layers and substantially parallel to each other. In addition, the second part of the conductive pillar forms a via stub. In the diagram of the insertion loss in magnitude versus frequency, the daisy chain structure can generate multiple obvious and distinguishable electromagnetic bandgap (EBG) stopbands. The corresponding relationship can be established between the maximum insertion loss ($|S_{dd21, min}$ (dB)|) obtained from the corresponding even-order stopband and the length of the via stub. In the application of printed circuit boards, the transmission line device in accordance with some embodiment of the disclosure has a simple structure, and can accurately determine the length of the via stub without the need for destructive cross-section (micro-section) measurement.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transmission line device, comprising:
a daisy chain structure composed of at least three daisy chain units arranged periodically and continuously, wherein each of the daisy chain units comprises:
a first conductive line and a second conductive line located at a first layer, extending along a first direction and discontinuously arranged;
a third conductive line located at a second layer, extending along the first direction and substantially parallel to the first conductive line and the second conductive line;
a first conductive pillar extending in a second direction different from the first direction, wherein the first conductive pillar has a first part and a second part, and the first part of the first conductive pillar is connected to the first conductive line and the third conductive line;
a second conductive pillar extending along the second direction, wherein the second conductive pillar has a first part and a second part, the first part of the second conductive pillar is connected to the second conductive line and the third conductive line; and
a first ground layer located at a third layer and extending along the first direction, wherein the third layer is located between the first layer and the second layer along the second direction.

2. The transmission line device as claimed in claim 1, wherein a first end and a second end of the first part of the first conductive pillar are respectively connected to a first terminal of the first conductive line and a first terminal of the third conductive line, and wherein a first end and a second end of the first part of the second conductive pillar are respectively connected to a first terminal of the second conductive line and a second terminal of the third conductive line.

3. The transmission line device as claimed in claim 1, wherein the first conductive line has a first length in the first direction, the second conductive line has a second length in the first direction, and the first length is equal to the second length.

4. The transmission line device as claimed in claim 3, wherein the third conductive line has a third length in the first direction, and the third length is equal to the total of the first length and the second length.

5. The transmission line device as claimed in claim 1, wherein the second part of the first conductive pillar has a first height in the second direction, the second part of the second conductive pillar has a second height in the second direction, and the first height is equal to the second height.

6. The transmission line device as claimed in claim 1, wherein the second conductive line of one of the daisy chain units is connected to the first conductive line of an, adjacent daisy chain unit.

7. The transmission line device as claimed in claim 1, wherein the third conductive line of one of the daisy chain units and the third conductive line of an, adjacent daisy chain unit are spaced apart from each other along the first direction.

8. The transmission line device as claimed in claim 1, wherein the first direction is a horizontal direction, and the second direction is a vertical direction.

9. The transmission line device as claimed in claim 1, further comprising:
a dielectric stack surrounding the third conductive lines, the first conductive pillars and the second conductive pillars of the daisy chain units and not surrounding the first conductive lines and the second conductive line of the daisy chain units.

10. The transmission line device as claimed in claim 9, wherein the first conductive lines and the second conductive lines of the daisy chain units are located on a first surface of the dielectric stack, and the third conductive lines of the daisy chain units, the first conductive pillars and the second conductive pillars are located between the first surface and a second surface of the dielectric stack.

11. The transmission line device as claimed in claim 10, wherein in each of the daisy chain units, a first end of the second part of the first conductive pillar is connected to a first terminal of the third conductive line, a second end of the second part of the first conductive pillar is located between the first surface and the second surface of the dielectric stack, a first end of the second part of a second conductive pillar is connected to the second terminal of the third conductive line, and wherein a second end of the second part of the second conductive pillar is located between the first surface and the second surface of the dielectric stack.

12. The transmission line device as claimed in claim 9, wherein:
the first ground layer of each of the daisy chain units is disposed in the dielectric stack.

13. The transmission line device as claimed in claim 12, wherein each of the daisy chain units further comprises:
a second ground layer located at a fourth layer, disposed in the dielectric stack, and extending along the first direction, wherein the second layer is located between the first layer and the fourth layer along the second direction.

14. The transmission line device as claimed in claim 13, further comprising:
a third ground layer located at a fifth layer, disposed in the dielectric stack and extending along the first direction, wherein the third ground layer is electrically isolated from each of the daisy chain units.

15. The transmission line device as claimed in claim 14, wherein the second layer is located between the first layer and the fifth layer along the second direction.

16. The transmission line device as claimed in claim 14, wherein the first conductive line, the second conductive line and the third conductive line of each of the daisy chain units are respectively a first microstrip line, a second microstrip line and a stripline of a printed circuit board.

17. The transmission line device as claimed in claim 16, wherein the first conductive pillar and the second conductive pillar of each of the daisy chain units are respectively a first via and a second via of the printed circuit board.

* * * * *